(12) United States Patent
Tu

(10) Patent No.: US 9,207,817 B2
(45) Date of Patent: Dec. 8, 2015

(54) CAPACITIVE TOUCHSCREENS FOR THERMOSTATS USING SMALLER CAPACITORS IN STANDBY MODE

(71) Applicant: Emerson Electric Co., St. Louis, MO (US)

(72) Inventor: Lihui Tu, Xi'an (CN)

(73) Assignee: Emerson Electric Co., St. Louis, MO (US)

(*) Notice: Subject to any disclaimer, the term of this patent is extended or adjusted under 35 U.S.C. 154(b) by 387 days.

(21) Appl. No.: 13/670,721

(22) Filed: Nov. 7, 2012

(65) Prior Publication Data

US 2013/0310985 A1 Nov. 21, 2013

(30) Foreign Application Priority Data

May 18, 2012 (CN) .......................... 2012 1 0156832

(51) Int. Cl.
*G06F 3/044* (2006.01)
*G05D 23/00* (2006.01)
*G06F 1/32* (2006.01)
*G06F 3/041* (2006.01)
*H03K 17/96* (2006.01)

(52) U.S. Cl.
CPC ................ *G06F 3/044* (2013.01); *G05D 23/00* (2013.01); *G06F 1/3231* (2013.01); *G06F 1/3262* (2013.01); *G06F 3/0416* (2013.01); *H03K 17/962* (2013.01); *Y02B 60/1289* (2013.01)

(58) Field of Classification Search
None
See application file for complete search history.

(56) References Cited

U.S. PATENT DOCUMENTS

| 6,961,015 | B2   |    11/2005 | Kernahan et al. |
| 7,434,742 | B2 * | 10/2008 | Mueller et al. ............... 236/46 C |
| 2005/0125083 | A1 * | 6/2005 | Kiko ................................ 700/19 |
| 2008/0277171 | A1 * | 11/2008 | Wright ........................ 178/18.06 |
| 2010/0245135 | A1   | 9/2010 | Camacho et al. |
| 2011/0157068 | A1 * | 6/2011 | Parker et al. ................... 345/174 |
| 2013/0261808 | A1 * | 10/2013 | Besore et al. ................. 700/278 |

FOREIGN PATENT DOCUMENTS

| CN | 201805414 | 4/2011 |
| CN | 102043500 | 5/2011 |

* cited by examiner

*Primary Examiner* — Mohammad Ali
*Assistant Examiner* — Bernard G Lindsay
(74) *Attorney, Agent, or Firm* — Harness, Dickey & Pierce, P.L.C.

(57) ABSTRACT

Exemplary embodiments are disclosed of touchscreen devices for thermostats and other electronic devices. In an exemplary embodiment, a capacitive touchscreen device includes a touchscreen having touch regions. Each touch region is coupled with at least one first capacitor and at least one second capacitor. The second capacitors are connected in parallel and have smaller capacitance than the first capacitors. The capacitive touchscreen device may be configured to be operable in a standby mode in which the second capacitors are charged and an active mode in which the first capacitors are charged.

20 Claims, 3 Drawing Sheets

CAPACITIVE TOUCHSCREENS FOR THERMOSTATS USING SMALLER CAPACITORS IN STANDBY MODE

CROSS-REFERENCE TO RELATED APPLICATION

This application claims the benefit and priority of Chinese Patent of Invention Application No. 201210156832.3, filed May 18, 2012. The entire disclosure of the above application is incorporated herein by reference.

FIELD

The present disclosure relates to capacitive touchscreens for thermostats.

BACKGROUND

This section provides background information related to the present disclosure which is not necessarily prior art.

Traditionally, battery-powered thermostats have included mechanical push buttons for operating the thermostat. But in many of today's electronic devices, touchscreen technology has become very popular. For example, many of today's electronic devices include capacitive touchscreens built into the display itself, giving the user very bright and crisp graphics, as they are very often used with dot matrix type displays.

SUMMARY

This section provides a general summary of the disclosure, and is not a comprehensive disclosure of its full scope or all of its features.

Exemplary embodiments are disclosed of touchscreen devices for thermostats and other electronic devices. In an exemplary embodiment, a capacitive touchscreen device includes a touchscreen having touch regions. Each touch region is coupled with at least one first capacitor and at least one second capacitor. The second capacitors are connected in parallel and have smaller capacitance than the first capacitors. The capacitive touchscreen device may be configured to be operable in a standby mode in which the second capacitors are charged and an active mode in which the first capacitors are charged.

Another exemplary embodiment provides a method for operating a capacitive touchscreen device that includes a touchscreen having a plurality of touch regions. Each touch region is coupled with at least one first capacitor and at least one second capacitor having a smaller capacitance than the first capacitor. This exemplary method includes charging the second capacitors when the capacitive touchscreen device is in a standby mode and charging the first capacitors when the capacitive touchscreen device is in an active mode. The method may also include switching the capacitive touchscreen device from the standby mode to the active mode in response to detection of a change in capacitance of one or more of the second capacitors.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

With conventional capacitive touchscreens, each section or touch region of the display is made up of a capacitive area, which is charged to a given voltage, and is discharged when a user touches the region. The inventor hereof has recognized that a robust power supply method is needed to charge each touch region on the display to a given voltage, to maintain that voltage, and then recharge the area after a user discharges it. While this is not an issue when the device is line powered in some fashion, the inventor hereof has further recognized that in electronic devices which are battery powered and employ a capacitive touchscreen, some measure of consideration must be given to power management.

Accordingly, the inventor discloses herein exemplary embodiments that help address the need for power management in battery powered devices (e.g., thermostats or other HVAC controllers, etc.) employing capacitive touchscreens, by having two capacitive areas per touch region or button. As disclosed herein, an exemplary embodiment includes an energy saving two layer (e.g., Indium titanium oxide (ITO), etc.) capacitive touchscreen with a liquid crystal display (LCD). The touchscreen includes a plurality of small capacitance capacitors in parallel with one another. One of the small capacitance capacitors (broadly, second capacitors) and a large capacitance capacitor are within each of one or more touch regions, areas, or buttons on the touchscreen. A controller is configured such that upon the change in capacitance of one or more of the small capacitance capacitors, the controller scans for a change in the capacitance of one of the large capacitance capacitors (broadly, first capacitors).

By way of example only, the small capacitance capacitors may have a capacitance within a range from about 10 picofarads to about 60 picofarads, while the large capacitance capacitors may have a capacitance within a range from about 60 picofarads to about 200 picofarads. By way of further example, the controller may be configured to detect whenever there is a change in capacitance of 5 picofarads (pF) or more, etc.

In addition to the small and large capacitance capacitors of the touch regions or buttons, exemplary embodiments may also include additional small capacitance capacitors (broadly, third capacitors) configured (e.g., coupled to, distributed or disposed about, etc.) other areas on the touchscreen, which areas are different or outside the touch regions or buttons. For example, a plurality of additional small capacitance capacitors may be arranged along the touchscreen so that a user may wake up the device (switch the device from a standby or sleep mode to an active or awake mode for user input) by touching anywhere on the touchscreen, including not only the touch regions or buttons having the small and large capacitors but also any other area on the touchscreen.

Figure 1:
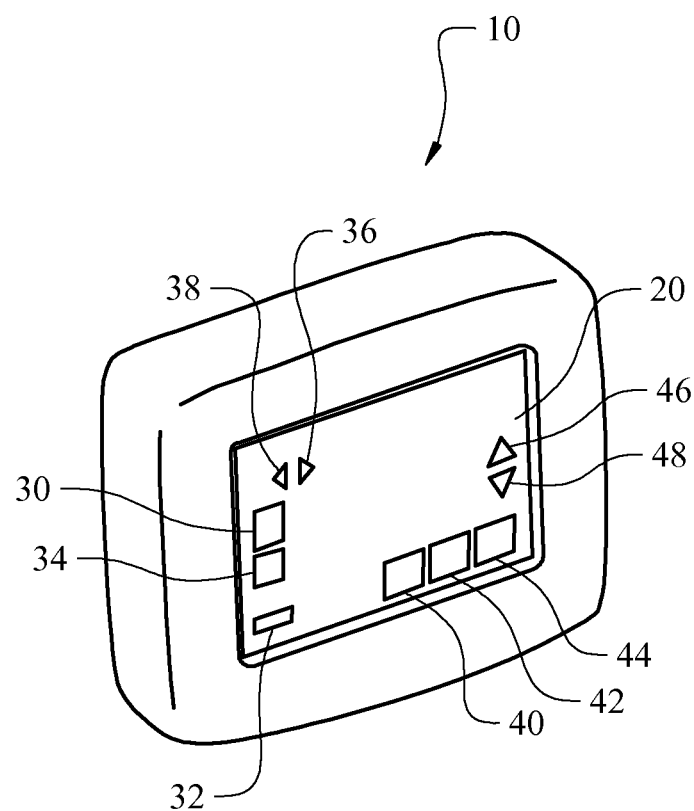
FIG. 1 illustrates an exemplary embodiment of a thermostat with a touchscreen according to an exemplary embodiment.

With reference now to the figures, FIG. 1 illustrates an exemplary embodiment of a thermostat 10 with a touchscreen 20 as a display device. The touchscreen 20 displays a plurality of user-interactive switches 30, 32, 34, 36, 38, 40, 42, 44, 46, 48 arranged on the surface of the touchscreen 20. In addition, the touchscreen 20 can display a plurality of user interface icons (not shown in FIG. 1) on the surface.

Figure 2:
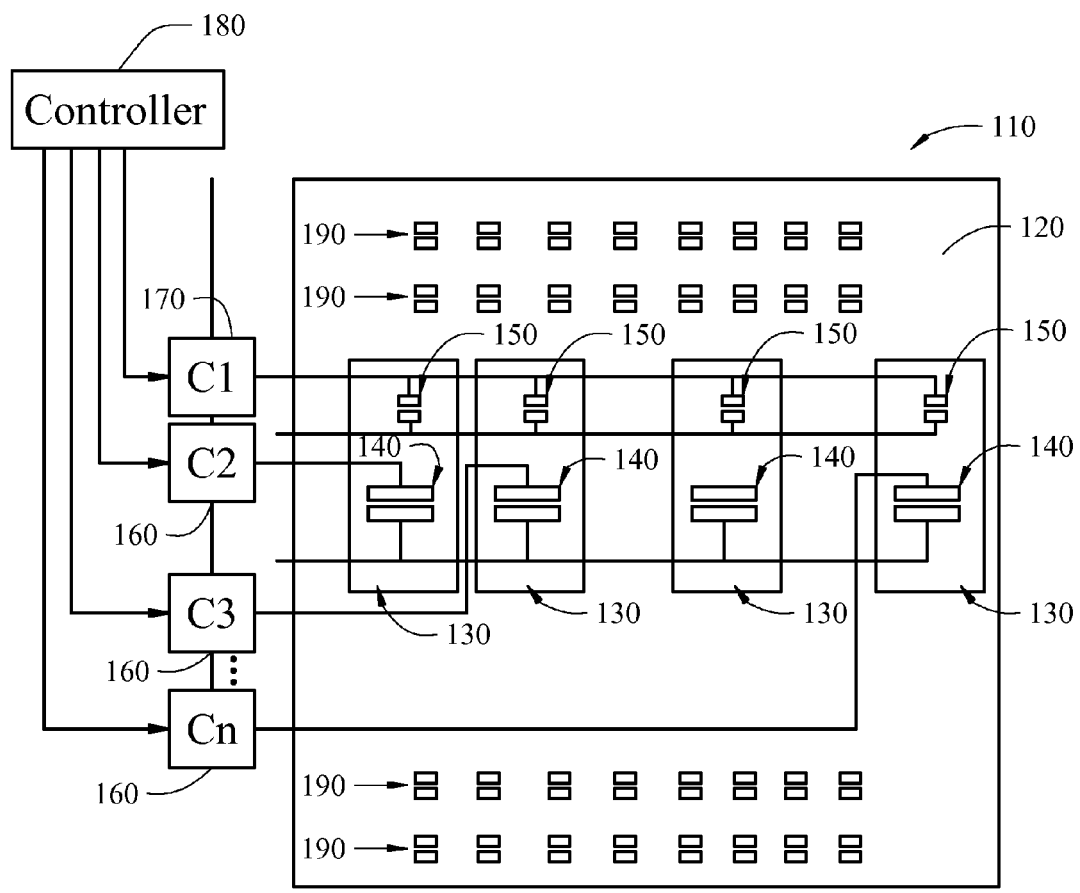
FIG. 2 illustrates a two layer Indium Titanium Oxide (ITO) panel for a touchscreen according to an exemplary embodiment.

FIG. 2 illustrates an exemplary embodiment of a panel for a touchscreen embodying one or more aspects of the present disclosure. As disclosed herein, the panel may help address the need for power management in a battery powered device 110 employing a capacitive touchscreen 120, such as thermostats (e.g., thermostat 10 shown in FIG. 1, etc.), other heating ventilation and air conditioning (HVAC) controllers, among other devices employing a capacitive touchscreen 120.

As shown in FIG. 2, this exemplary embodiment includes two capacitive areas per touch region or button 130 (e.g., defined key areas, etc.). Each touch region or button 130 is mutually isolated from the others. For each touch region or button 130, one of its two capacitive areas is coupled with a first or large capacitor 140 and is connected to a unique input port 160 (e.g., see C2, C3, . . . C$_n$ in FIG. 2) to the microprocessor 180. The large capacitor 140 is discharged by the user in interacting with the device 110, e.g., when the user touches the touch region or button 130 having that large capacitor 140. The large capacitive value helps to ensure that the touch by the user is interpreted correctly by the microprocessor or microcontroller 180 as a specific input. The touch region's other capacitive area is coupled with a second or small capacitor 150 that is much smaller than the large capacitor 140, and is connected in parallel with several other smaller capacitive areas to a common input 170 (e.g., see C1 in FIG. 2) on the microprocessor 180.

The voltage required to maintain the charge on these smaller capacitive areas (e.g., 1.5 volts, etc.) is much less than the total voltage (e.g., 5 volts, etc.) required to maintain the charge on the larger capacitive areas and smaller capacitive areas. To conserve battery life in the device, the large capacitive areas may thus only be charged when the device is being used (e.g., being programmed by a user, etc.), or in the case of a thermostat, such as when the user is making changes to the temperature set point or changing the heating ventilation and air conditioning (HVAC) system setting (e.g., from heat to cool, from cool to heat, from off to on, or from on to off).

During the rest of time the touchscreen or panel 120 is in a standby mode. In the standby mode, only the smaller capacitive areas are charged for the purpose of detecting that the screen 120 is touched. But the microprocessor 180 does not detect which specific region or area of the touchscreen 120 is touched. Once the microprocessor or microcontroller 180 receives the signal when the touchscreen 120 is touched, the microprocessor 180 then wakes up and causes the large capacitive areas to be charged so that the large capacitive areas can generate an input by the user.

In this exemplary manner, the life of the battery(ies) for powering the device 110 can be greatly extended by not charging the large capacitors 140 continuously, but only when a screen touch is detected. In addition to only utilizing the smaller capacitive areas during the inactive period, the microprocessor or microcontroller 180 may also turn off the backlight or additionally deactivate the display itself to further conserve energy and therefore battery life.

Accordingly, this exemplary embodiment thus provides an energy saving two-layer capacitive touchscreen 120. The touchscreen 120 includes the plurality of small capacitive capacitors 150 connected in parallel with one another. One of the small capacitive capacitors 150 and a large capacitive capacitor 140 are within each of touch regions or buttons 130 on the touchscreen 120. Accordingly, the touch regions or buttons 130 are mutually isolated from each other as the large and small capacitors 140, 150 of each touch region or button 130 are not shared by the other touch regions or buttons 130. A microcontroller 180 is configured such that upon the capacitive change in one or more of the small capacitive capacitors 150, the microcontroller 180 scans for a capacitive change in one of the large capacitive capacitors 140.

An exemplary embodiment provides a method of saving energy by scanning only one capacitive sense pin or sensor. Indium titanium oxide (ITO) is used to design a large capacitor 140 and a small capacitor 150 for each touch region or button 130. The large capacitor 140 and the small capacitor 150 are very close to each other, e.g., within each of the touch regions or buttons 130 on the touchscreen 120. When a user touches any touch region or button 130, the microcontroller 180 wakes up (switches the device from a standby or sleep mode to an active or awake mode for user input) because of the capacitive change of the small capacitor 150. Then, the microcontroller 180 scans all the capacitive sensors for the capacitive change in one of the large capacitors 140, in order to obtain a key code associated with the capacitive change of the large capacitive capacitor 140.

In addition to the large and small capacitance capacitors 140, 150 within the touch regions or buttons 130, FIG. 2 also illustrates additional small capacitance capacitors 190 distributed or disposed about other areas of the touchscreen 120 outside the touch regions or buttons 130. For example, there are also plurality of additional small capacitance capacitors 190 connected in parallel and disposed above the touch regions or buttons 130. Additional small capacitance capacitors 190 are also connected in parallel and provided below the touch regions or buttons 130. Preferably, the additional small capacitors 190 are arranged along the touchscreen 120 so that a user may wake up the device by touching anywhere on the touchscreen 120, including not only the touch regions or buttons 130 having the large and small capacitors 140, 150, but also any other place or area on the touchscreen 120. Accordingly, a user may also wake up the device by touching the touchscreen 120 to cause a capacitive change in one or more additional small capacitance capacitors 190.

In some exemplary embodiments, the small capacitors 150, 190 may remain charged while the device in the active mode. In other exemplary embodiments, the device may be configured such that the small capacitors 150, 190 are not charged but only the large capacitors 140 are charged when the device is in the active mode, which, in turn, may allow further reductions in energy consumption.

By way of example only, the small capacitance capacitors 150, 190 may have a capacitance within a range from about 10 picofarads to about 60 picofarads. The large capacitance capacitors 140 may have a capacitance within a range from about 60 picofarads to about 200 picofarads. By way of further example, the microcontroller 180 may be configured to detect whenever there is change in capacitance in a capacitor of 5 picofarads (pF) or more, etc. These particular values and particular ranges of values are provided as examples only, as alternative embodiments may have larger or smaller capacitance capacitors and/or be configured to detect different changes in capacitance.

Figure 3:
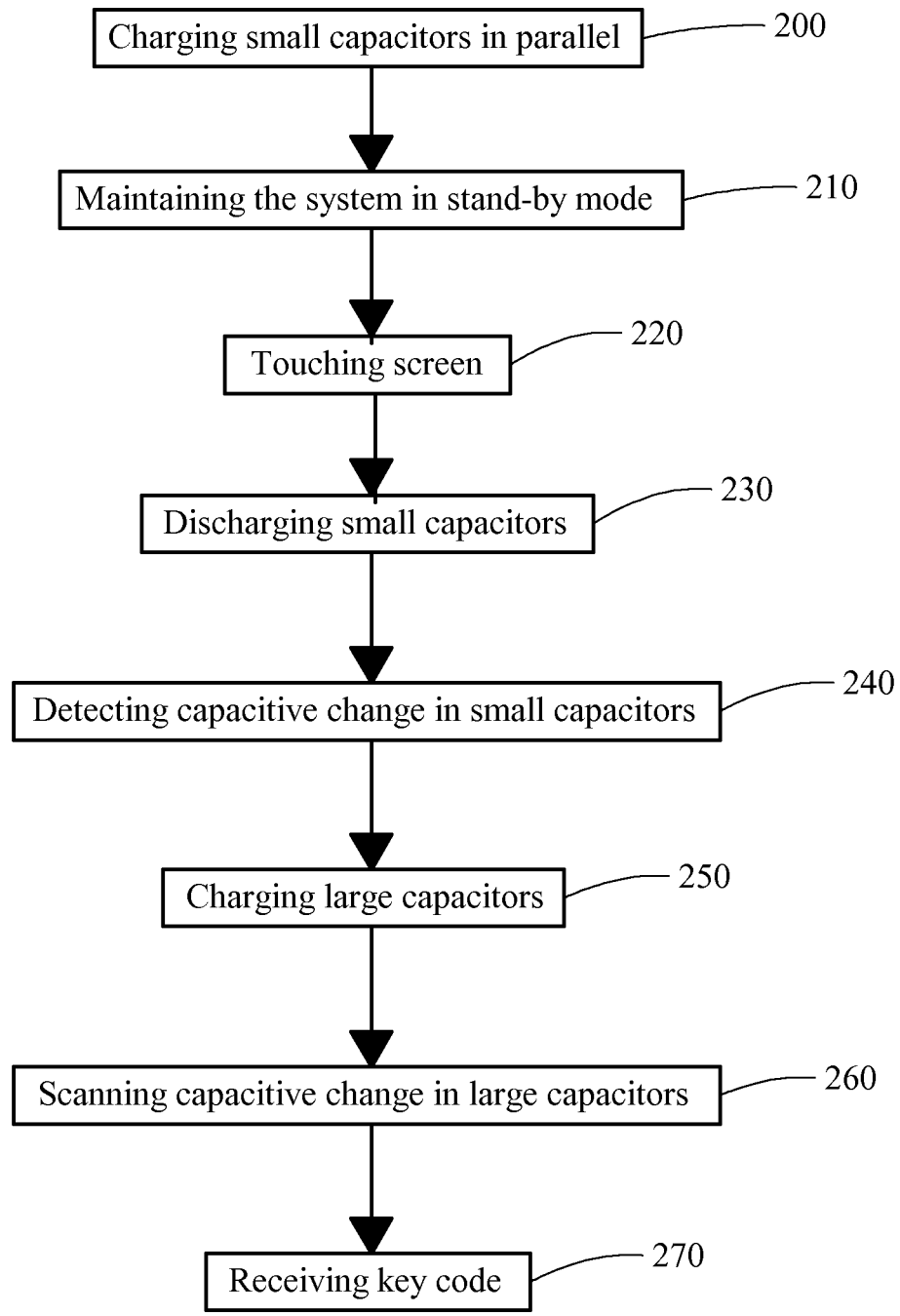
FIG. 3 is a flow chart illustrating a basic operating process of a capacitive touchscreen according to an exemplary embodiment.

FIG. 3 illustrates a basic operating process of a battery powered device with a capacitive touchscreen according to an exemplary embodiment. Initially, only the small capacitors connected in parallel are charged at step 200. Thus, the system is maintained in a standby mode at step 210 when the system is not in use. When a user touches any one of the touch buttons or regions at step 220, one or more of the small capacitors that are coupled with the buttons or regions touched by the user are discharged at step 230. As the small capacitors are discharged, the controller detects the capacitive change in one or more of the small capacitors at step 240, and instructs the large capacitors to be charged at step 250. Then, the microcontroller scans any capacitive change in each of the large capacitors to determine which touch button is in use at step 260. The microcontroller then receives a key code associated with each of the large capacitors that experiences the capacitive change at step 270.

Advantageously, exemplary embodiments are disclosed herein that may thus save energy consumption by charging only the small capacitance capacitors in standby mode, which are used as the sensor or wake-up button for the microcontroller. Additionally, the location of the wake-up button is not fixed and may advantageously be placed in any or all regions in the touchscreen in exemplary embodiments.

Various exemplary embodiments of the disclosure are described with reference to thermostats. Other or additional configurations are also possible in relation to other devices, controllers, controls, and control systems other than thermostats. The power management systems, methods, and schemes disclosed herein may be used with devices having touchscreens besides just thermostats, which other devices may be battery-powered and/or powered by electrical wiring.

In addition, exemplary embodiments are disclosed herein of thermostats having indium tin oxide (ITO) capacitive touchscreens with liquid crystal displays (LCDs). But other exemplary embodiments may include thermostats or other devices having differently configured touchscreens, such as touchscreens formed with other materials, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms (e.g., different materials other than Indium tin oxide, etc.), and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). Similarly, it is envisioned that disclosure of two or more ranges of values for a parameter (whether such ranges are nested, overlapping or distinct) subsume all possible combination of ranges for the value that might be claimed using endpoints of the disclosed ranges.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items. The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A capacitive touchscreen device comprising:
   a controller;
   a plurality of single first capacitors, each having an individual unique input port to the controller;
   a plurality of single second capacitors connected in parallel and having a common input port to the controller that is separate from any of the first capacitor input ports, each single second capacitor being different from each single first capacitor and having a smaller individual capacitance than an individual capacitance of any of the single first capacitors; and
   a touchscreen including a plurality of mutually isolated touch regions, each said touch region being coupled with one of the single first capacitors and one of the single second capacitors;
   whereby the capacitive touchscreen device is configured to be operable in a standby mode in which the single second capacitors are charged and the single first capacitors are not charged to reduce power consumption by the single first capacitors, and to switch to an active mode in which the single first capacitors are charged in response to a detection of a change in capacitance of one or more of the single second capacitors by the controller;
   wherein in the standby mode the single second capacitors are charged via the common input port and in the active mode the single first capacitors are charged via each corresponding individual unique input port; and
   wherein the controller is configured to scan only the single first capacitors for a change in capacitance during the active mode to determine which touch region is being touched by a user.

2. The capacitive touchscreen device of claim 1, wherein the capacitive touchscreen device is configured to switch from the standby mode in which the single first capacitors are not charged to the active mode in response to a detection of a change in capacitance of one or more of the single second capacitors caused when a user touches one or more of the touch regions, and wherein in the active mode the single first capacitors are charged to allow the touch regions to be used for user input.

3. The capacitive touchscreen device of claim 1, wherein the single first and second capacitors of each touch region are not shared by the other touch regions.

4. The capacitive touchscreen device of claim 1, wherein the controller is configured to detect a capacitive change in the plurality of the single second capacitors when a user touches one or more of the touch regions.

5. The capacitive touchscreen device of claim 4, wherein at least one of:
   the controller is configured to detect a capacitive change of 5 picofarads or more;
   the single first capacitors have a capacitance from 60 picofarads to 200 picofarads; or
   the single second capacitors have a capacitance from 10 picofarads to 60 picofarads.

6. The capacitive touchscreen device of claim 1, further comprising a plurality of single third capacitors coupled to areas on the touchscreen different than the touch regions, each of the single third capacitors having a smaller capacitance than an individual capacitance of any of the single first capacitors.

7. The capacitive touchscreen device of claim 6, wherein the capacitive touchscreen device is configured such that:
   when the capacitive touchscreen device is in the standby mode, the single first capacitors are not charged while the single second and third capacitors are charged for allowing detection that a user has touched the touchscreen;
   the single first capacitors are charged when the capacitive touchscreen device is in the active mode, for allowing the touch regions to be used for user input; and
   the capacitive touchscreen device switches from the standby mode to the active mode in response to detection of a change in capacitance of any one or more of the single second and third capacitors caused when a user touches an area on the touchscreen coupled to the one or more single second and third capacitors.

8. The capacitive touchscreen device of claim 7, wherein the single second and third capacitors are configured such that there is detectable change in capacitance for switching the capacitive touchscreen device from the standby mode to the active mode when a user touches anywhere on the touchscreen.

9. The capacitive touchscreen device of claim 1, wherein the capacitive touchscreen device includes a two layer Indium Titanium Oxide (ITO) panel.

10. A thermostat comprising the capacitive touchscreen device of claim 1.

11. A controller for a heating ventilation and air conditioning (HVAC) system, the controller including the capacitive touchscreen device of claim 1.

12. The capacitive touchscreen device of claim 1, wherein the single second capacitors are not charged when the capacitive touchscreen device is operated in the active mode.

13. A method for operating a capacitive touchscreen device comprising a controller, a plurality of single first capacitors each having an individual unique input port to the controller, a plurality of single second capacitors connected in parallel and having a common input port to the controller that is separate from any of the first capacitor input ports, and a touchscreen having a plurality of mutually isolated touch regions, each said touch region being coupled one of the single first capacitors and one of the single second capacitors, each single second capacitor being different from each single first capacitor and having a smaller individual capacitance than an individual capacitance of any of the single first capacitors, the method comprising:
   charging the single second capacitors without charging the single first capacitors when the capacitive touchscreen device is in a standby mode to reduce power consumption by the single first capacitors;
   charging the first capacitors when the capacitive touchscreen device is in an active mode, wherein in the standby mode the single second capacitors are charged via the common input port and in the active mode the single first capacitors are charged via each corresponding individual unique input port;
   scanning only the single first capacitors for a change in capacitance during the active mode to determine which touch region is being touched by a user; and switching the capacitive touchscreen device from the standby mode to the active mode in response to detection of a change in capacitance of one or more of the single second capacitors by the controller.

14. The method of claim 13, wherein the method includes switching from the standby mode in which the single first capacitors are not charged to the active mode in which the single first capacitors are charged to allow the touch regions to be used for user input, in response to a detection of a change in capacitance of one or more of the single second capacitors caused when a user touches one or more of the touch regions.

15. The method of claim 13, further comprising
charging a plurality of single third capacitors coupled to areas on the touchscreen different than the touch regions, the single third capacitors each having a smaller individual capacitance than an individual capacitance of any of the first capacitors; and
charging the single first capacitors in response to detection of a change in capacitance of any one or more of the single second and third capacitors.

16. The method of claim 15, wherein the single second and third capacitors are configured such that there is a detectable change in capacitance when a user touches anywhere on the touchscreen.

17. The method of claim 15, wherein the method includes:
charging the single second and third capacitors without charging the single first capacitors when the capacitive touchscreen device is in the standby mode, such that the single first capacitors are not charged until detection of a change in capacitance of any one or more of the single second and third capacitors; and
switching from the standby mode in which the single first capacitors are not charged to the active mode in which the single first capacitors are charged to allow the touch regions to be used for user input, in response to a detection of a change in capacitance of any one or more of the single second and third capacitors.

18. The method of claim 13, further comprising:
receiving a key code associated with a single first capacitor that has a capacitive change.

19. The method of claim 13, wherein the method includes charging the single first capacitors without charging the single second capacitors when the capacitive touchscreen device is in an active mode.

20. The method of claim 13, wherein the capacitive touchscreen device includes a two layer Indium Titanium Oxide (ITO) panel.

\* \* \* \* \*